US007638253B2

(12) United States Patent
Park et al.

(10) Patent No.: US 7,638,253 B2
(45) Date of Patent: Dec. 29, 2009

(54) PHOTORESIST COMPOSITION AND METHOD OF MANUFACTURING A THIN-FILM TRANSISTOR SUBSTRATE USING THE SAME

(75) Inventors: Jeong-Min Park, Seoul (KR); Doo-Hee Jung, Seoul (KR); Hi-Kuk Lee, Gyeonggi-do (KR); Hyoc-Min Youn, Gyeonggi-do (KR); Ki-Hyuk Koo, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/082,436

(22) Filed: Apr. 11, 2008

(65) Prior Publication Data

US 2008/0254634 A1 Oct. 16, 2008

(30) Foreign Application Priority Data

Apr. 13, 2007 (KR) .................... 10-2007-0036565

(51) Int. Cl.
*G03F 7/004* (2006.01)
*G03F 7/023* (2006.01)
*G03F 7/30* (2006.01)

(52) U.S. Cl. .................... 430/170; 430/191; 430/192; 430/193; 430/270.1; 430/313; 430/326; 438/149; 438/151

(58) Field of Classification Search ................ 430/191, 430/192, 193, 270.1, 313, 326, 170; 438/149, 438/151
See application file for complete search history.

(56) References Cited

U.S. PATENT DOCUMENTS

| 5,216,111 A | * | 6/1993 | Zampini .................... 528/143 |
| 5,709,977 A | * | 1/1998 | Tan et al. .................... 430/192 |
| 5,723,254 A | * | 3/1998 | Zampini et al. ............ 430/190 |
| 6,511,783 B1 | * | 1/2003 | Uenishi .................... 430/270.1 |
| 7,291,439 B2 | * | 11/2007 | Park et al. .................... 430/191 |
| 2007/0111412 A1 | * | 5/2007 | Oh et al. .................... 438/158 |

FOREIGN PATENT DOCUMENTS

| JP | 2005-507509 | 3/2005 |
| KR | 1999-0063688 | 7/1999 |
| KR | 2006-0005349 | 1/2006 |

OTHER PUBLICATIONS

English Language Abstract, Publication No. JP 2005-507509, Mar. 17, 2005, 1 p.
English Language Abstract, Publication No. KR 1999-0063688, Jul. 26, 1999, 1 p.
English Language Abstract, Publication No. KR 2006-0005349, Jan. 17, 2006, 1 p.

* cited by examiner

*Primary Examiner*—John S Chu
(74) *Attorney, Agent, or Firm*—Innovation Counsel LLP

(57) ABSTRACT

In one example, a photoresist composition includes about 1 to about 70 parts by weight of a first binder resin including a repeat unit represented by the following Chemical Formula 1, about 1 to about 70 parts by weight of a second binder resin including a repeat unit represented by the following Chemical Formula 2, about 0.5 to about 10 parts by weight of a photo-acid generator, about 1 to about 20 parts by weight of a cross-linker and about 10 to about 200 parts by weight of a solvent. The photoresist composition may improve the heat resistance and adhesion ability of a photoresist pattern.

<Chemical Formula 1>

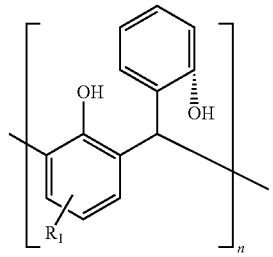

<Chemical Formula 2>

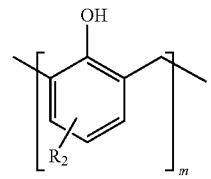

wherein $R_1$ and $R_2$ independently represent an alkyl group having 1 to 5 carbon atoms, and n and m independently represent a natural number.

9 Claims, 9 Drawing Sheets

PHOTORESIST COMPOSITION AND METHOD OF MANUFACTURING A THIN-FILM TRANSISTOR SUBSTRATE USING THE SAME

CROSS-REFERENCE TO RELATED APPLICATIONS

This application claims priority under 35 USC § 119 to Korean Patent Application No. 2007-36565, filed on Apr. 13, 2007 in the Korean Intellectual Property Office (KIPO), the contents of which are herein incorporated by reference in their entirety.

BACKGROUND OF THE INVENTION

1. Field of the Invention

The present invention relates to a photoresist composition and a method of manufacturing a thin-film transistor substrate using the photoresist composition. More particularly, the present invention relates to a photoresist composition capable of being used for a four-mask process and a method of manufacturing a thin-film transistor substrate using the photoresist composition.

2. Description of the Related Art

A liquid crystal display (LCD) apparatus displays an image using optical and electrical properties of liquid crystal, such as an anisotropic refractive index and an anisotropic dielectric constant. The LCD apparatus has characteristics such as lighter weight, lower power consumption, lower driving voltage, etc., in comparison with other types of display apparatuses, such as a cathode ray tube (CRT), a plasma display panel (PDP) and so on.

Generally, the LCD apparatus includes an LCD panel and a light source providing the LCD panel with light. The LCD panel includes a plurality of pixels and a plurality of thin-film transistors (TFTs). The pixels and the TFTs are formed through a photolithography process using a photoresist composition. Recently, a four-mask process using four masks for forming the TFTs has been developed so as to simplify processes for forming the TFTs.

In the four-mask process, a photoresist pattern formed on a data metal layer includes a channel portion having a relatively small thickness. A conventional photoresist composition has relatively low heat resistance so that the channel portion of the photoresist pattern is deformed in the course of baking the photoresist pattern. In order to solve the above-mentioned problems, a photoresist composition having relatively high heat resistance has been developed. However, the adhesion ability between a photoresist pattern formed using the photoresist composition and a substrate on which the photoresist pattern is formed may be deteriorated.

SUMMARY OF THE INVENTION

The present invention provides a photoresist composition capable of improving the heat resistance and adhesion ability of a photoresist pattern.

The present invention also provides a method of manufacturing a thin-film transistor substrate using the above-mentioned photoresist composition.

In one aspect of the present invention, a photoresist composition includes about 1 to about 70 parts by weight of a first binder resin containing a repeat unit represented by the following Chemical Formula 1, about 1 to about 70 parts by weight of a second binder resin containing a repeat unit represented by the following Chemical Formula 2, about 0.5 to about 10 parts by weight of a photo-acid generator, about 1 to about 20 parts by weight of a cross-linker and about 10 to about 200 parts by weight of a solvent.

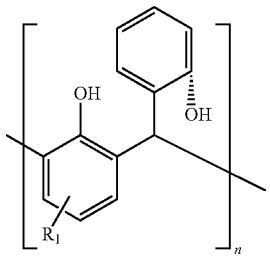

<Chemical Formula 1>

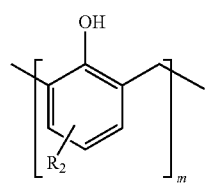

<Chemical Formula 2>

(wherein $R_1$ and $R_2$ independently represent an alkyl group having 1 to 5 carbon atoms, and n and m independently represent a natural number.)

The first binder resin may be prepared by reacting a phenol compound with salicylic aldehyde. The second binder resin may be prepared by reacting a phenol compound with an aldehyde compound in the presence of an acidic catalyst. For example, a weight-average molecular weight of the first and second binder resins may be about 1,000 to about 10,000.

Examples of the photo-acid generator may include an onium salt, a halogenated organic compound, a quinone diazide compound, a bis(sulfonyl)diazomethane compound, a sulfone compound, an organic acid-ester compound, an organic acid-amide compound, an organic acid-imide compound, etc. Examples of the cross-linker may include an alkoxymethylated urea resin, an alkoxymethylated melamine resin, an alkoxymethylated uron resin, an alkoxymethylated glycol uryl resin, etc. Examples of the solvent may include a glycol ether, an ethylene glycol alkyl ether acetate, a diethylene glycol, etc.

The photoresist composition may further include a phenol compound represented by the following Chemical Formula 3.

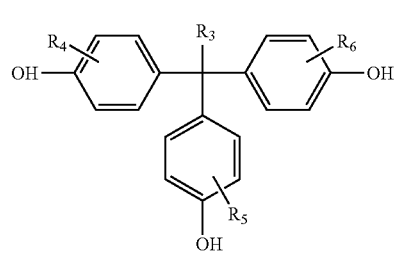

<Chemical Formula 3>

(wherein $R_3$, $R_4$, $R_5$ and $R_6$ independently represent an alkyl group having 1 to 4 carbon atoms.)

Furthermore, the photoresist composition may further include about 0.1 to about 5 parts by weight of a dye. Examples of the dye may include a pyrazoleazo-based dye, an anilinoazo-based dye, an arylazo-based dye, a triphenylmethane-based dye, an anthraquinone-based dye, an anthrapyridone-based dye, a benzylidene-based dye, an oxonol-based dye, a pyrazoletriazoleazo-based dye, a pyridoneazo-based dye, a cyanine-based dye, a phenothiazine-based dye, a pyrrolopyrazoleazomethine-based dye, a xanthene-based dye, a phthalocyanine-based dye, a benzopyran-based dye, an indigo-based dye, etc.

Furthermore, the photoresist composition may further include an additive such as an adhesion promotion agent, a surfactant, an acid diffusion suppressant, etc. For example, a content of the additive may be about 0.1 to about 10 parts by weight.

In another aspect of the present invention, a gate insulation layer, an active layer and a data metal layer are sequentially formed on a base substrate having a gate line and a gate electrode. A photoresist composition is coated on the data metal layer to form a photoresist film. The photoresist composition includes about 1 to about 70 parts by weight of a first binder resin containing a repeat unit represented by the following Chemical Formula 1, about 1 to about 70 parts by weight of a second binder resin containing a repeat unit represented by the following Chemical Formula 2, about 0.5 to about 10 parts by weight of a photo-acid generator, about 1 to about 20 parts by weight of a cross-linker and about 10 to about 200 parts by weight of a solvent.

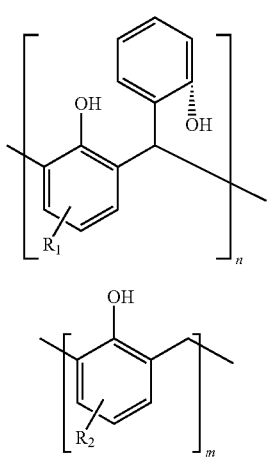

<Chemical Formula 1>

<Chemical Formula 2>

(wherein $R_1$ and $R_2$ independently represent an alkyl group having 1 to 5 carbon atoms, and n and m independently represent a natural number.)

The photoresist film is exposed to light and developed to form a first photoresist pattern. The data metal layer and the active layer are etched using the first photoresist pattern as a mask to form a data line and a channel portion. A portion of the first photoresist film is removed to form a second photoresist pattern exposing a portion of the data metal layer. The data metal layer and the active layer are etched using the second photoresist pattern as a mask to form a source electrode, a drain electrode and an ohmic contact pattern.

For example, the data metal layer may be etched through a wet etching process. The second photoresist pattern may have a channel region having a relatively small thickness.

According to the above, the heat resistance and adhesion ability of a photoresist pattern may be improved. Thus, the aperture ratio of a thin-film transistor substrate may be increased, and the display quality of a display apparatus may be improved.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE INVENTION

Figure 1:
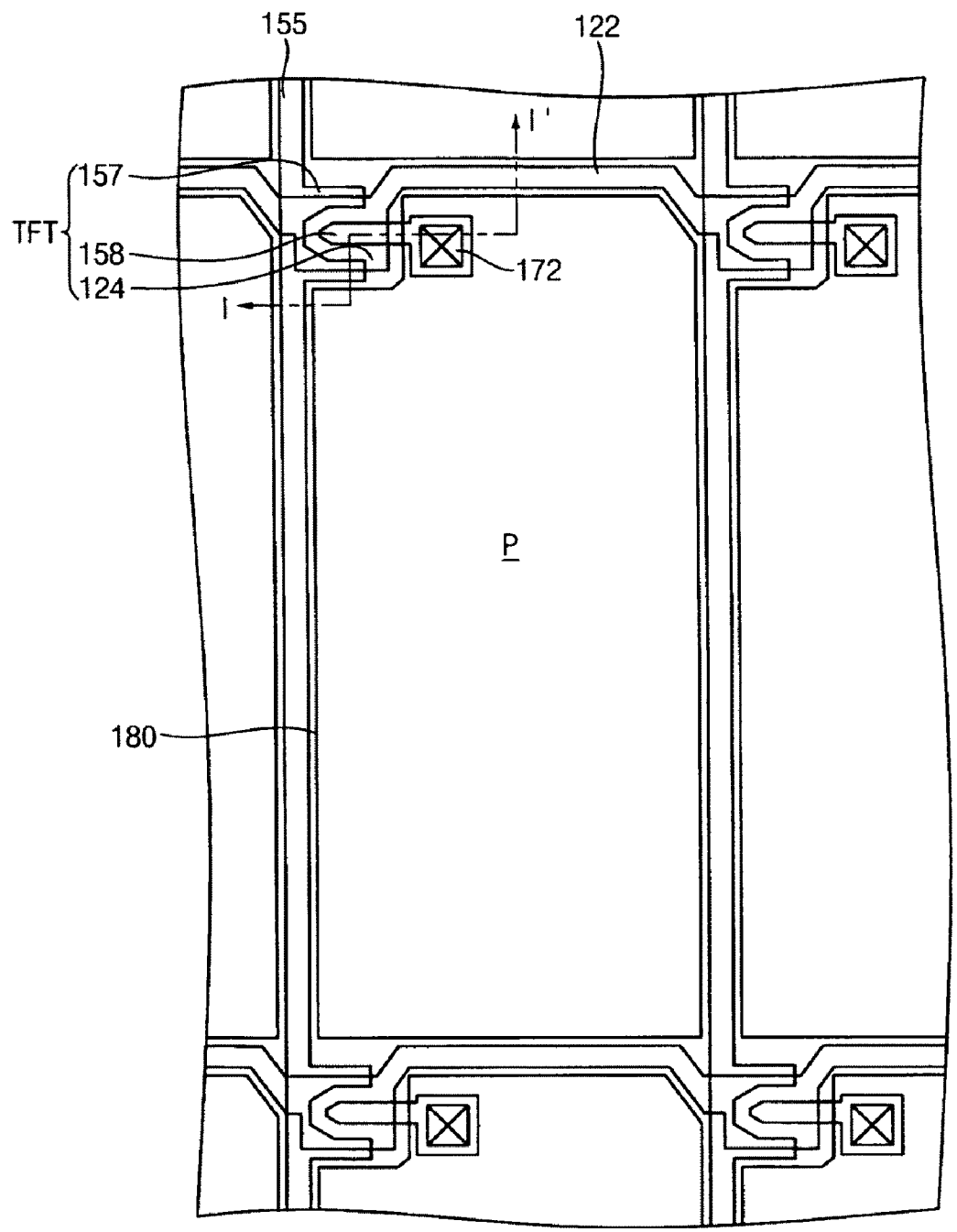
FIG. 1 is a plan view illustrating a thin-film transistor substrate manufactured according to an example embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Photoresist Composition

A photoresist composition according to an example embodiment of the present invention includes about 1 to about 70 parts by weight of a first binder resin containing a repeat unit represented by the following Chemical Formula 1, about 1 to about 70 parts by weight of a second binder resin containing a repeat unit represented by the following Chemical Formula 2, about 0.5 to about 10 parts by weight of a photo-acid generator, about 1 to about 20 parts by weight of a cross-linker and about 10 to about 200 parts by weight of a solvent.

<Chemical Formula 1>

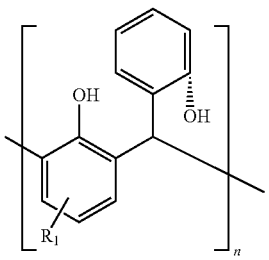

-continued

<Chemical Formula 2>

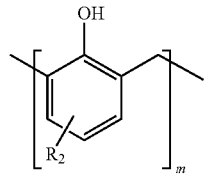

(wherein $R_1$ and $R_2$ independently represent an alkyl group having 1 to 5 carbon atoms, and n and m independently represent a natural number.)

The first binder resin is soluble in an alkali solution. For example, the first binder resin may be prepared by reacting a phenol compound with an aldehyde compound in the presence of an acidic catalyst. Particularly, the first binder resin may be prepared by reacting the phenol compound with salicylic aldehyde.

The second binder resin is soluble in an alkali solution. For example, the second binder resin may be prepared by reacting a phenol compound with an aldehyde compound in the presence of an acidic catalyst. Particularly, the second binder resin may be prepared by reacting the phenol compound with formaldehyde.

Examples of the phenol compound may include phenol, o-cresol, m-cresol, p-cresol, 2,3-dimethylphenol, 3,4-dimethylphenol, 3,5-dimethylphenol, 2,4-dimethylphenol, 2,6-dimethylphenol, 2,3,6-trimethylphenol, 2-t-butylphenol, 3-t-butylphenol, 4-t-butylphenol, 2-methylresorcinol, 4-methylresorcinol, 5-methylresorcinol, 4-t-butylcatechol, 2-methoxyphenol, 3-methoxyphenol, 2-propylphenol, 3-propylphenol, 4-propylphenol, 2-isopropylphenol, 2-methoxy-5-methylphenol, 2-t-butyl-5-methylphenol, thymol, isothymol, etc. These can be used alone or in a combination thereof. Preferably, a mixture of m-cresol and p-cresol may be used in view of controlling the sensitivity of the photoresist composition. A weight ratio of m-cresol to p-cresol may be about 80:20 to about 20:80, and preferably about 70:30 to about 50:50.

The photoresist composition may further include a novolac resin used for a conventional photoresist composition. The novolac resin may be prepared by reacting a phenol compound with an aldehyde compound or a ketone compound in the presence of an acidic catalyst.

Examples of the aldehyde compound may include formaldehyde, formalin, p-formaldehyde, trioxane, acetaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-methylbenzaldehyde, m-methylbenzaldehyde, p-methylbenzaldehyde, p-ethylbenzaldehyde, p-n-butylbenzaldehyde, terephthalic acid aldehyde, etc. These can be used alone or in a combination thereof.

Examples of the ketone compound may include acetone, methylethylketone, diethylketone, diphenylketone, etc. These can be used alone or in a combination thereof.

A polystyrene-reduced weight-average molecular weight of the first binder resin and the second binder resin, which is measured by gel permeation chromatography (GPC), may be about 1,000 to about 10,000, and preferably about 3,000 to about 9,000. When the molecular weight of the first binder resin and the second binder resin is excessively small, a photoresist pattern formed from the photoresist composition may be damaged by an alkali developing solution. When the molecular weight of the first binder resin and the second binder resin is excessively high, the photoresist pattern may not be clear since a solubility difference between an exposed portion and an unexposed portion is small.

The first binder resin has a relatively high heat resistance. The second binder resin has relatively high adhesion ability. Thus, the photoresist composition preferably includes both the first binder resin and the second binder resin. A weight ratio of the first binder resin to the second binder resin may be about 70:30 to about 40:60. When the content of the first binder resin is excessively great, the adhesion ability of a photoresist pattern formed from the photoresist composition may be deteriorated. When the content of the second binder resin is excessively great, the heat resistance of the photoresist pattern may be reduced.

The photo-acid generator is provided with light to generate an acid such as Bronsted acid, Lewis acid, etc. Examples of the photo-acid generator may include an onium salt, a halogenated organic compound, a quinone diazide compound, a bis(sulfonyl)diazomethane compound, a sulfone compound, an organic acid-ester compound, an organic acid-amide compound, an organic acid-imide compound, etc. These can be used alone or in a combination thereof.

Examples of the onium compound may include a diazonium salt, an ammonium salt, an iodonium salt such as diphenyliodonium triflate, a sulfonium salt such as triphenylsulfonium triflate, a phosphonium salt, an arsonium salt, an oxonium salt, etc. These can be used alone or in a combination thereof.

Examples of the halogenated organic compound may include a halogen-containing oxadiazole compound, a halogen-containing triazine compound, a halogen-containing triazine compound, a halogen-containing acetophenone compound, a halogen-containing benzophenone compound, a halogen-containing sulfoxide compound, a halogen-containing sulfonic compound, a halogen-containing thiazole compound, a halogen-containing oxazole compound, a halogen-containing triazole compound, a halogen-containing 2-pyrone compound, a halogen-containing heterocyclic compound, a halogen-containing aliphatic hydrocarbon, a halogen-containing aromatic hydrocarbon, a sulfenyl halide compound, etc. These can be used alone or in a combination thereof.

Particularly, examples of the halogenated organic compound may include tris(2,3-dibromopropyl)phosphate, tris(2,3-dibromo-3-chloropropyl)phosphate, tetrabromochlorobutane, 2-[2-(3,4-dimethoxyphenyl)ethenyl]4,6-bis(trichloromethyl)-S-triazine, hexachlorobenzene, hexabromobenzene, hexabromocyclododecane, hexabromocyclododecene, hexabromobiphenyl, allyltribromophenylether, tetrachlorobisphenol A, tetrabromobisphenol A, bis(chloroethyl)ether of tetrachlorobisphenol A, tetrachlorobisphenol S, tetrabromobisphenol S, bis(2,3-dichloropropyl)ether of tetrachlorobisphenol A, bis(2,3-dibromopropyl)ether of tetrabromobisphenol A, bis(chloroethyl)ether of tetrachlorobisphenol S, bis(bromoethyl)ether of tetrabromobisphenol S, bis(2,3-dichloropropyl)ether of bisphenol S, bis(2,3-dibromopropyl)ether of bisphenol S, tris(2,3-dibromopropyl)isocyanurate, 2,2-bis(4-hydroxy-3,5-dibromophenyl)propane, 2,2-bis(4-(2-hydroxyethoxy)-3,5-dibromophenyl)propane, dichlorodiphenyltrichloroethane, pentachlorophenol, 2,4,6-trichlorophenyl-4-nitrophenylether, 4,5,6,7-tetrachlorophthalide, 1,1-bis(4-chlorophenyl)ethanol, 1,1-bis(4-chlorophenyl)-2,2,2-trichloroethanol, 2,4,4',5-tetrachlorodiphenylsulfide, 2,4,4',5-tetrachlorodiphenylsulfone, etc. These can be used alone or in a combination thereof.

Examples of the quinone diazide compound may include a sulfonic acid ester of a quinone diazide derivative such as 1,2-benzoquinonediazide-4-sulfonic acid ester, 1,2-naphthoquinonediazide-4-sulfonic acid ester, a sulfonic acid chloride of a quinone diazide derivative such as 1,2-benzoquinone-2-diazide-4-sulfonic acid chloride, 1,2-naphthoquinone-2-diazide-4-sulfonic acid chloride, 1,2-naphthoquinone-2-diazide-5-sulfonic acid chloride, 1,2-naphthoquinone-1-diazide-6-sulfonic acid chloride, 1,2-benzoquinone-1-diazide-5-sulfonic acid chloride, etc. These can be used alone or in a combination thereof.

Examples of the bis(sulfonyl)diazomethane compound may include α,α'-bis(sulfonyl)diazomethane containing an alkyl group, an alkenyl group, an aralkyl group, an aromatic group or a heterocyclic group, which may be symmetrically substituted, non-symmetrically substituted, or may not be substituted. These can be used alone or in a combination thereof.

Examples of the sulfone compound may include a sulfone compound and a disulfone compound, which contains an alkyl group, an alkenyl group, an aralkyl group, an aromatic group or a heterocyclic group, which may be symmetrically substituted, non-symmetrically substituted, or may not be substituted. These can be used alone or in a combination thereof.

Examples of the organic acid ester may include carboxylic acid ester, sulfonic acid ester, phosphoric acid ester, etc. Examples of the organic acid amide may include carboxylic acid amide, sulfonic acid amide, phosphoric acid amide, etc. Examples of the organic acid imide may include carboxylic acid imide, sulfonic acid imide, phosphoric acid imide, etc. These can be used alone or in a combination thereof.

Moreover, examples of the photo-acid generator may further include cyclohexylmethyl(2-oxocyclohexyl)sulfonium trifluoromethane sulfonate, dicyclohexylmethyl(2-oxocyclohexyl)sulfonium trifluoromethane sulfonate, 2-oxocyclohexyl(2-norbornyl)sulfonium trifluoromethane sulfonate, 2-cyclohexylsulfonylcyclohexanone, dimethyl(2-oxocyclohexyl)sulfonium trifluoromethane sulfonate, triphenylsulfonium trifluoromethane sulfonate, diphenyliodonium trifluoromethane sulfonate, N-hydroxysuccinimidyl trifluoromethane sulfonate, phenyl p-toluene sulfonate, α-carbonyl-α-sulfonyldiazomethane containing an alkyl group, an alkenyl group, an aralkyl group, an aromatic group or a heterocyclic group, which may be symmetrically substituted, non-symmetrically substituted, or may not be substituted. These can be used alone or in a combination thereof.

When the content of the photo-acid generator is excessively small, a photoresist pattern formed from the photoresist composition may not be clear since an amount of an acid generated by light exposure is not sufficient. When the content of the photo-acid generator is excessively great, a photoresist pattern formed from the photoresist composition may have a round edge, or may be damaged in the course of a development process.

The cross-linker is activated by the acid generated by the photo-acid generator to be combined with the binder resin. Thus, the binder resin is cross-linked.

Examples of the cross-linker may include an alkoxymethylated amino resin such as an alkoxymethylated urea resin, an alkoxymethylated uron resin, an alkoxymethylated glycoluril resin. Furthermore, examples of the cross-linker may further include an alkyletherified melamine resin, a benzoguanamine resin, an alkyletherified benzoguanamine resin, a urea resin, an alkyletherified urea resin, a urethane-formaldehyde resin, a resol-type phenol formaldehyde resin, an alkyletherified resol-type phenol formaldehyde resin, an epoxy resin, etc. Particularly, a methoxymethylated amino resin, a methoxyethylated amino resin, an n-butoxymethylated amino resin, etc. may be used. These can be used alone or in a combination thereof. Preferably, the methoxyethylated amino resin such as hexamethoxymethylmelamine, hexamethylolmelamine hexamethylether, etc. may be used in view of the resolution of the photoresist composition.

When the content of the cross-linker is excessively small, a cross-linking reaction may not be sufficiently performed. Thus, a remaining ratio of a photoresist pattern may be reduced, or the photoresist pattern may be easily deformed. When the content of the cross-linker is excessively great, the resolution of the photoresist pattern may be reduced, or an adhesion between the photoresist and a substrate may be deteriorated.

For example, a weight ratio of the photo-acid generator to the cross-linker may be about 1:1 to about 1:40, and preferably about 1:2 to about 1:20, and more preferably about 1:3 to about 1:10 in view of resolution, heat resistance and an adhesion with a substrate.

Examples of the solvent include alcohols such as methanol and ethanol, ethers such as tetrahydrofurane, glycol ethers such as ethylene glycol monomethyl ether and ethylene glycol monoethyl ether, ethylene glycol alkyl ether acetates such as methyl cellosolve acetate and ethyl cellosolve acetate, diethylene glycols such as diethylene glycol monomethyl ether, diethylene glycol monoethyl ether and diethylene glycol dimethyl ether, propylene glycol monoalkyl ethers such as propylene glycol methyl ether, propylene glycol ethyl ether, propylene glycol propyl ether and propylene glycol butyl ether, propylene glycol alkyl ether acetates such as propylene glycol methyl ether acetate, propylene glycol ethyl ether acetate, propylene glycol propyl ether acetate and propylene glycol butyl ether acetate, propylene glycol alkyl ether propionates such as propylene glycol methyl ether propionate, propylene glycol ethyl ether propionate, propylene glycol propyl ether propionate and propylene glycol butyl ether propionate, aromatic compounds such as toluene and xylene, ketones such as methyl ethyl ketone, cyclohexanone and 4-hydroxy-4-methyl-2-pentanone, and ester compounds such as methyl acetate, ethyl acetate, propyl acetate, butyl acetate, ethyl 2-hydroxypropionate, methyl 2-hydroxy-2-methyl propionate, ethyl 2-hydroxy-2-methyl propionate, methyl hydroxyacetate, ethyl hydroxyacetate, butyl hydroxyacetate, methyl lactate, ethyl lactate, propyl lactate sulfate, butyl lactate, methyl 3-hydroxypropionate, ethyl 3-hydroxypropionate, propyl 3-hydroxypropionate, butyl 3-hydroxypropionate, methyl 2-hydroxy-3-methyl butanoate, methyl methoxy acetate, ethyl methoxy acetate, propyl methoxy acetate, butyl methoxy acetate, methyl ethoxy acetate, ethyl ethoxy acetate, propyl ethoxy acetate, butyl ethoxy acetate, methyl propoxy acetate, ethyl propoxy acetate, propyl propoxy acetate, butyl propoxy acetate, methyl butoxy acetate, ethyl butoxy acetate, propyl butoxy acetate, butyl butoxy acetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, butyl 3-butoxypropionate, etc. Among the above examples, glycol ethers, ethylene glycol alkyl ether acetates and diethylene glycols are preferably used in view of the solubility and reactivity of each of the components composing the photoresist composition and a manufacturing condition of a coating layer.

The photoresist composition may further include about 0.1 to about 10 parts by weight of a phenol compound having a relatively low molecular weight. The phenol compound may improve the etching resistance and adhesion ability of a photoresist pattern. Examples of the phenol compound may include 4,4',4"-methylidynetrisphenol, 4,4',4"-ethylidynetrisphenol, 4-[bis(4-hydroxyphenyl)methyl]-2-methoxyphenol, 4-[bis(4-hydroxyphenyl)methyl]-2-ethoxyphenol, 4,4'-[(2-hydroxyphenyl)methylene]bis[2-methylphenol], 4,4'-[(4-hydroxyphenyl)methylene]bis[2-methylphenol], 4,4'-[(3-hydroxyphenyl)methylene]bis[2,6-dimethylphenol], etc. These can be used alone or in a combination thereof.

Particularly, examples of the phenol compound may include a compound represented by the following Chemical Formula 3.

<Chemical Formula 3>

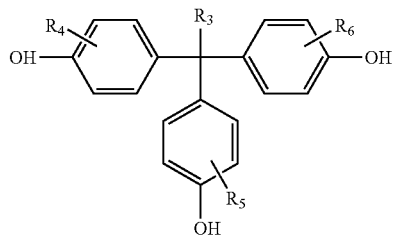

(wherein $R_3$, $R_4$, $R_5$ and $R_6$ independently represent an alkyl group having 1 to 4 carbon atoms.)

The photoresist composition may further include about 0.1 to about 5 parts by weight of a dye. When the content of the dye is less than 0.1 parts by weight, a photoresist pattern having a halftone may not be formed. When the content of the dye is more than 5 parts by weight, an exposure amount needed in an exposing process may be excessively increased.

The dye may serve to control the contrast of a photoresist pattern. The dye may be selected in view of solubility and heat resistance. Examples of the dye may include a pyrazoleazo-based dye, an anilinoazo-based dye, an arylazo-based dye, a triphenylmethane-based dye, an anthraquinone-based dye, an anthrapyridone-based dye, a benzylidene-based dye, an oxonol-based dye, a pyrazoletriazoleazo-based dye, a pyridoneazo-based dye, a cyanine-based dye, a phenothiazine-based dye, a pyrrolopyrazoleazomethine-based dye, a xanthene-based dye, a phthalocyanine-based dye, a benzopyran-based dye, an indigo-based dye, etc. These can be used alone or in a combination thereof.

The photoresist composition may further include an additive such as an adhesion promotion agent, a surfactant, an acid diffusion suppressant, etc. For example, a content of the additive may be about 0.1 to about 10 parts by weight.

The adhesion promotion agent may improve an adhesion between a substrate and a photoresist pattern formed from the photoresist composition. Examples of the adhesion promotion agent may include a silane coupling agent containing a reactive substitution group such as a carboxyl group, a methacrylic group, an isocyanate group, an epoxy group, etc. Particularly, examples of the silane coupling agent may include γ-methacryloxypropyl trimethoxy silane, vinyl triacetoxy silane, vinyl trimethoxy silane, γ-isocyanate propyl triethoxy silane, γ-glycidoxy propyl trimethoxy silane, β-(3, 4-epoxy cyclohexyl)ethyl trimethoxy silane, etc.

The surfactant may improve coating characteristics and development characteristics of the photoresist composition. Examples of the surfactant may include polyoxyethylene octylphenylether, polyoxyethylene nonylphenylether, F171, F172, F173 (trade name, manufactured by Dainippon Ink in Japan), FC430, FC431 (trade name, manufactured by Sumitomo 3M in Japan), KP341 (trade name, manufactured by Shin-Etsu Chemical in Japan), etc.

The acid diffusion suppressant may prevent an acid from diffusing into an area that is not exposed to light. Examples of the photosensitizer may include an amine, ammonium hydroxide, a photosensitive base, etc. Particularly, examples of acid diffusion suppressant may include tetrabutylammonium hydroxide, triethanolamine, diethanolamine, trioctylamine, n-octylamine, trimethylsulfonium hydroxide, triphenylsulfonium hydroxide, etc.

The photoresist composition according to an example embodiment of the present invention may improve the heat resistance and adhesion ability of a photoresist pattern. Particularly, the photoresist composition may be used for a four-mask process so as to form a photoresist pattern having different thicknesses.

Hereinafter, a method of manufacturing a thin-film transistor substrate according to an example embodiment of the present invention will be described more fully with reference to the accompanying drawings.

Method of Manufacturing a Thin-film Transistor Substrate

FIG. 1 is a plan view illustrating a thin-film transistor substrate manufactured according to an example embodiment of the present invention. FIGS. 2, 3, 4, 5, 6, 7 and 8 are cross-sectional views illustrating a method of manufacturing a thin-film transistor substrate according to an example embodiment of the present invention. Particularly, FIGS. 2, 3, 4, 5, 6, 7 and 8 respectively illustrate a cross-section taken along a line I-I' of FIG. 1.

Figure 2:
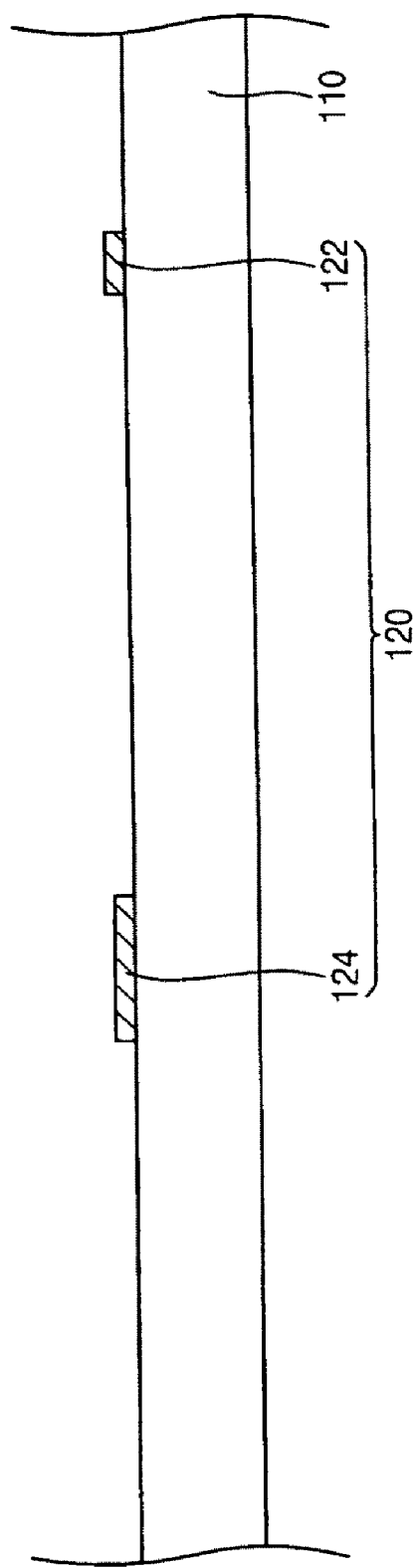
FIGS. 2, 3, 4, 5, 6, 7 and 8 are cross-sectional views illustrating a method of manufacturing a thin-film transistor substrate according to an example embodiment of the present invention.

Referring to FIGS. 1 and 2, after a gate metal layer is formed on a base substrate 110, the gate metal layer is patterned through a photolithography process using a first mask to form a gate pattern 120 including a gate line 122 and a gate electrode 124 electrically connected to the gate line 122. For example, the gate metal layer may be formed on the base substrate 110 through a sputtering method. The gate metal layer may be etched through a wet-etching process.

The base substrate 110 may be a transparent insulation substrate. Examples of a material that may be used for the base substrate 110 may include glass, etc.

Examples of a material that may be used for the gate pattern 120 may include aluminum (Al), molybdenum (Mo), neodymium (Nd), chromium (Cr), tantalum (Ta), titanium (Ti), tungsten (W), copper (Cu), silver (Ag), an alloy thereof, etc. The gate pattern 120 may have a double-layered structure including at least two metal layers having different physical characteristics. For example, the gate pattern 120 may have an Al/Mo double-layered structure including an Al layer and a Mo layer so as to reduce resistance.

The gate line 122 may extend in a first direction and define a first boundary and a second boundary parallel with the first boundary, of a pixel P. The gate electrode 124 is electrically connected to the gate line 122 and serves as a gate terminal of a thin-film transistor TFT formed in the pixel P.

Figure 3:
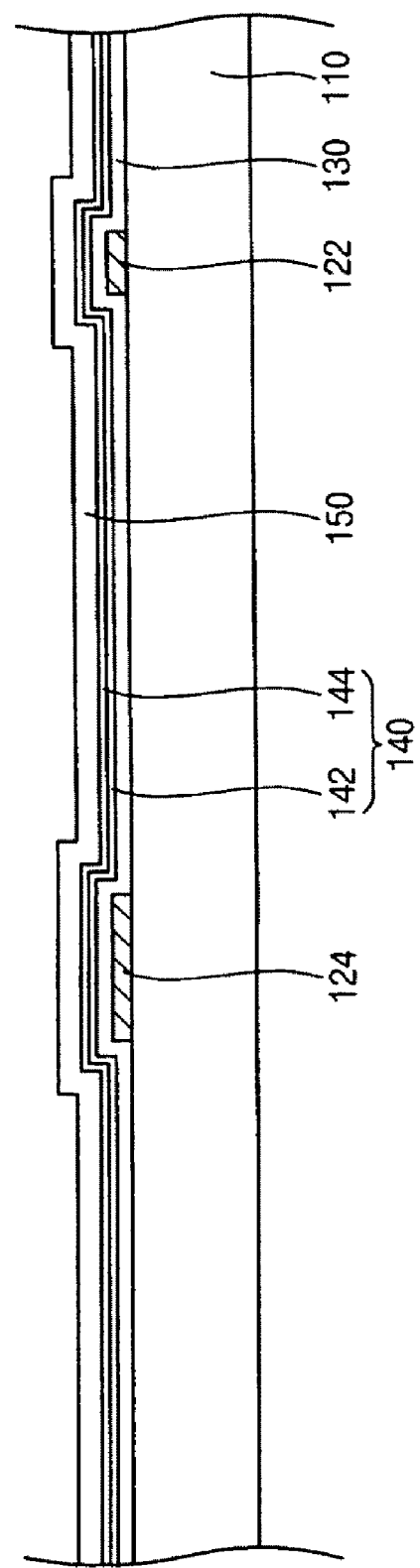

Referring to FIG. 3, a gate insulation layer 130 and an active layer 140 are sequentially formed on the base substrate 110 having the gate pattern 120. The gate insulation layer 130 and the active layer 140 may be formed through plasma-enhanced chemical vapor deposition (PECVD) in one example.

The gate insulation layer 130 may protect and insulate the gate pattern 120. Examples of a material that may be used for the gate insulation layer 130 may include silicon nitride, silicon oxide, etc. For example, a thickness of the gate insulation layer 130 may be about 4,500 Å.

The active layer 140 includes a semiconductor layer 142 and an ohmic contact layer 144. Examples of a material that may be used for the semiconductor layer 142 may include amorphous silicon, and examples of a material that may be used for the ohmic contact layer 133 may include amorphous silicon into which $n^+$ impurities are implanted at a high concentration.

A data metal layer 150 is formed on the active layer 140. In one example, the data metal layer 150 may have a Mo/Al/Mo triple-layered structure so as to reduce the resistance of the data metal layer 150. Alternatively, the data metal layer 150 may have a single layer including Mo, Al, etc.

Figure 4:
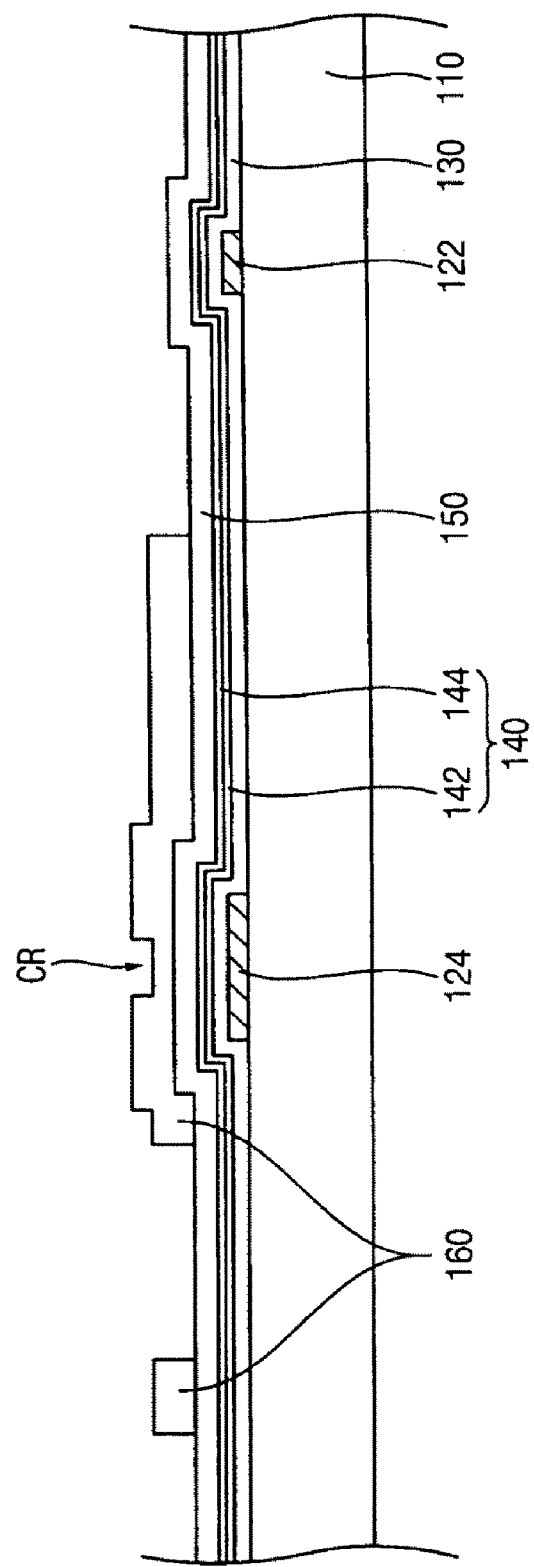

Referring to FIG. 4, a photoresist composition is coated on the data metal layer 150 to form a photoresist film. The photoresist film is exposed to light by using a second mask, such as a slit mask or a halftone mask, and then developed to form a first photoresist pattern 160.

The photoresist composition includes about 1 to about 70 parts by weight of a first binder resin containing a repeat unit represented by the following Chemical Formula 1, about 1 to about 70 parts by weight of a second binder resin containing a repeat unit represented by the following Chemical Formula 2, about 0.5 to about 10 parts by weight of a photo-acid generator, about 1 to about 20 parts by weight of a cross-linker, and about 10 to about 200 parts by weight of a solvent.

<Chemical Formula 1>

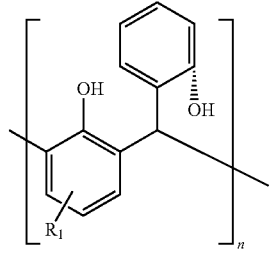

<Chemical Formula 2>

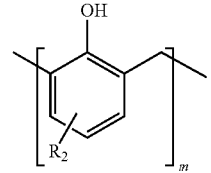

(wherein $R_1$ and $R_2$ independently represent an alkyl group having 1 to 5 carbon atoms, and n and m independently represent a natural number.)

The first binder resin is soluble in an alkali solution. For example, the first binder resin may be prepared by reacting a phenol compound with an aldehyde compound in the presence of an acidic catalyst. Particularly, the first binder resin may be prepared by reacting the phenol compound with salicylic aldehyde.

The second binder resin is soluble in an alkali solution. For example, the second binder resin may be prepared by reacting a phenol compound with an aldehyde compound in the presence of an acidic catalyst. Particularly, the second binder resin may be prepared by reacting the phenol compound with formaldehyde.

The photoresist composition is substantially the same as the photoresist composition previously described above. Thus, any further description will be omitted.

The first photoresist pattern 160 has a channel region CR having a relatively small thickness compared to a remaining portion. For example, the thickness of the channel region CR may be about 5,000 to about 8,000 Å.

Figure 5:
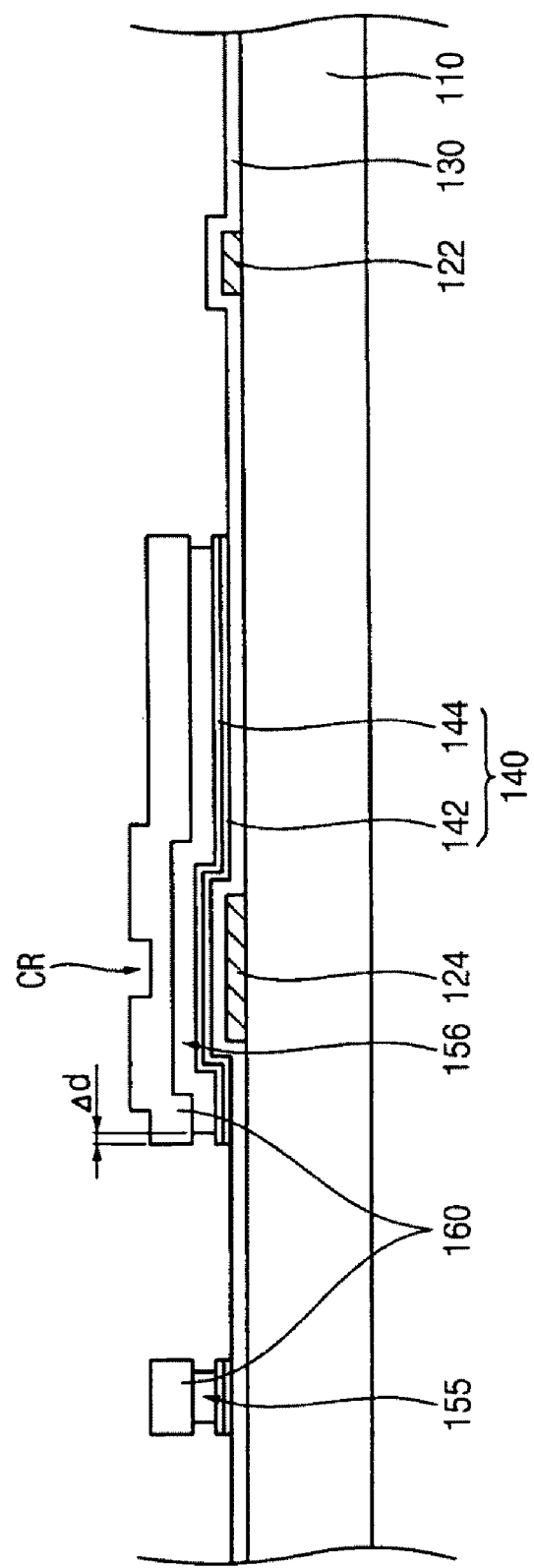

Referring to FIGS. 1 and 5, the data metal layer 150 is etched using the first photoresist pattern 160 as a mask. For example, the data metal layer 150 may be etched through a wet etching process.

After the data metal layer 150 is etched by the wet etching process using the first photoresist pattern 160, a data line 155 and a source/drain metal pattern 156 remain. The data line 155 may extend in a second direction substantially perpendicular to the first direction and define a third boundary and a fourth boundary parallel with the third boundary, of the pixel P, the third and fourth boundaries being perpendicular to the first and second boundaries.

Since the data metal layer 150 is etched through the wet etching process, an edge of the data line 155 and an edge of the source/drain metal pattern 156 does not coincide with an edge of the first photoresist pattern 160 to form an undercut. The photoresist composition may improve the adhesion ability of the photoresist pattern to reduce a width Δd of the undercut. When the width Δd of the undercut is reduced, a length of a protruding portion of a channel portion may be reduced. As a result, the aperture ratio of the pixel may be increased.

Thereafter, the active layer 140 is etched using the first photoresist pattern 160 as a mask. For example, the active layer 140 may be etched through a dry etching process. After the active layer 140 is etched, a remaining semiconductor layer 142 forms a channel portion of the thin-film transistor TFT.

Figure 6:
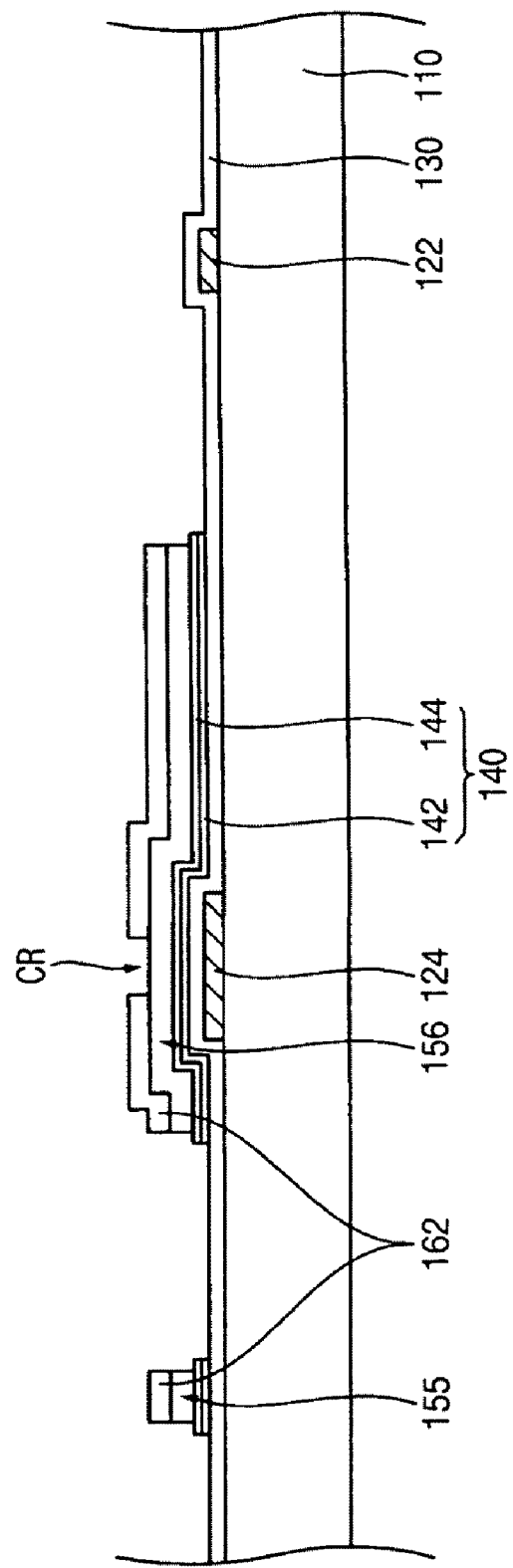

Referring to FIGS. 5 and 6, the first photoresist pattern 160 is etched by a predetermined thickness to form a second photoresist pattern 162 having an opening corresponding to the channel region CR. Thus, a portion of the source/drain metal pattern 156 corresponding to the channel region CR is exposed.

Alternatively, the active layer 140 may be etched after the second photoresist pattern 162 is formed.

Figure 7:
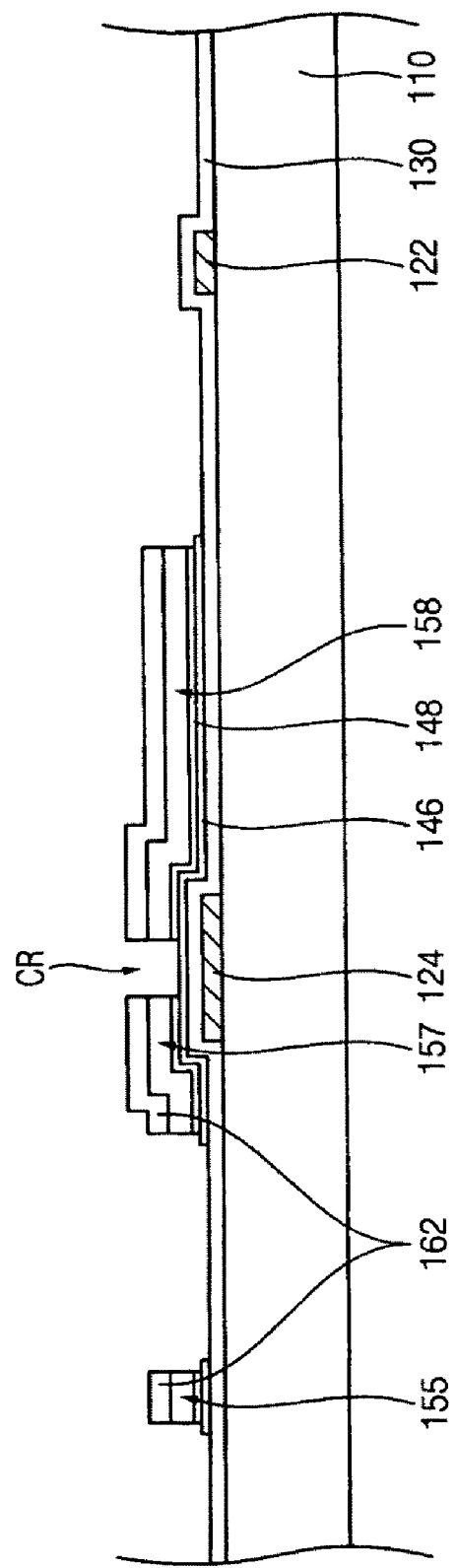

Referring to FIGS. 1 and 7, the portion of source/drain metal pattern 156 exposed through the opening of the second photoresist pattern 162 is etched using the second photoresist pattern 162 as a mask to form a source electrode 157 and a drain electrode 158. The source/drain metal pattern 156 may be etched by a wet etching process.

The source electrode 157 is electrically connected to the data line 155, and serves as a source terminal of the thin-film transistor TFT. The drain electrode 158 is spaced apart from the source electrode 157, and serves as a drain terminal of the thin-film transistor TFT.

Thereafter, an exposed portion of the ohmic contact layer, which corresponds to the channel region CR, is etched using the second photoresist pattern 162 as a mask to form a pair of ohmic contact patterns 148 on the channel portion 146. The ohmic contact patterns 148 are spaced apart from each other. Thereafter, the second photoresist pattern 162 is removed. For example, the second photoresist pattern 162 may be removed through a stripping process using a stripping solution.

Figure 8:
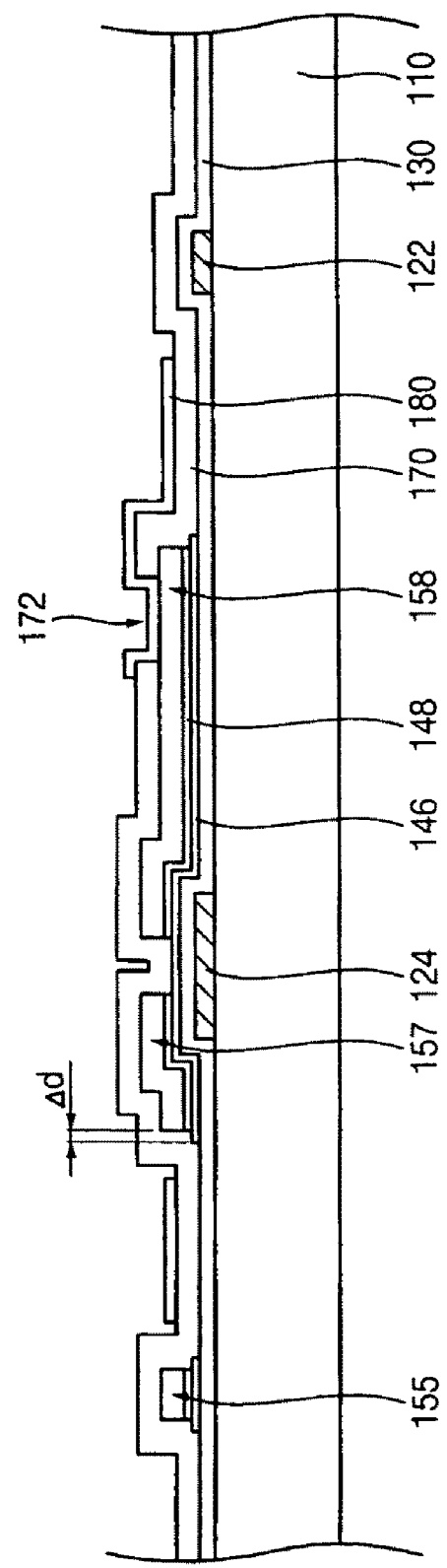

Referring to FIGS. 1 and 8, a passivation layer 170 is formed on the base substrate 110 having the thin-film transistor TFT. The passivation layer 170 protects and insulates the thin-film transistor and the data line 155. Examples of a material that may be used for the passivation layer 170 may include silicon nitride, silicon oxide, etc. For, example, the passivation layer 170 may be formed through a chemical vapor deposition (CVD) method, and a thickness of the passivation layer 170 may be about 500 to about 2,000 Å.

The passivation layer 170 is patterned through a photolithography process using a third mask to form a contact hole 172 exposing a portion of the drain electrode 158.

After the contact hole 172 is formed, a transparent conductive layer is formed on the passivation layer 170. The transparent conductive layer is patterned through a photolithography process using a fourth mask to form a pixel electrode 180 in the pixel P.

The pixel electrode 180 is electrically connected to the drain electrode 158 through the contact hole 172 formed through the passivation layer 170. Examples of a material that may be used for the pixel electrode 180 may include indium zinc oxide, indium tin oxide, etc.

Alternatively, before the pixel electrode 180 is formed, an organic insulation layer (not shown) may be formed on the passivation layer 170 to planarize the base substrate 110.

The method of manufacturing a thin-film transistor substrate according to an example embodiment of the present invention may increase the adhesion ability and heat resistance of a photoresist pattern. Thus, a width of an undercut formed under the photoresist pattern may be reduced. Therefore, the length of a protrusion of a channel portion may be reduced so that the aperture ratio of the thin-film transistor substrate is increased.

The photoresist composition and the method of manufacturing a thin-film transistor substrate according to embodiments of the present invention will be further described hereinafter through Examples and Comparative Examples.

EXAMPLE 1

A phenol mixture including m-cresol and p-cresol in a weight ratio of about 40:60 was reacted with salicylic aldehyde to prepare a first binder resin, of which a weight-average molecular weight was about 7,000. A phenol mixture including m-cresol and p-cresol in a weight ratio of about 40:60 was reacted with formaldehyde to prepare a second binder resin, of which a weight-average molecular weight was about 4,000. About 30 g of the first binder resin, about 70 g of the second binder resin, about 2 g of a compound represented by the following Chemical Formula 4 as a photo-acid generator, about 5 g of hexamethylolmelamine hexamethylether as a cross-linker, about 0.6 g of UV yellow 1549 as an azo-based dye, about 1 g of trioctylamine as an additive and about 400 g of propyleneglycol methylether propionate as a solvent were mixed with each other to prepare a photoresist composition.

<Chemical Formula 4>

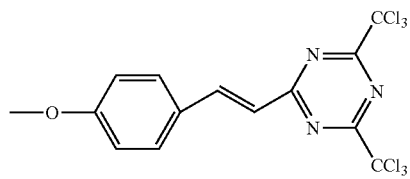

EXAMPLE 2

A photoresist composition was prepared through substantially the same method as Example 1 except that the photoresist composition included about 70 g of the first binder resin and about 30 g of the second bidner resin.

EXAMPLE 3

A photoresist composition was prepared through substantially the same method as Example 1 except that the photoresist composition further included about 3 g of a compound represented by the following Chemical Formula 5.

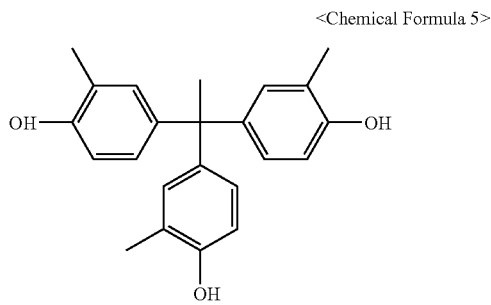

<Chemical Formula 5>

EXAMPLE 4

A photoresist composition was prepared through substantially the same method as Example 3 except that the photoresist composition included about 6 g of the compound represented by Chemical Formula 5 of Example 3.

EXAMPLE 5

A photoresist composition was prepared through substantially the same method as Example 3 except that the photoresist composition included about 9 g of the compound represented by Chemical Formula 5 of Example 3.

COMPARATIVE EXAMPLE 1

A photoresist composition was prepared through substantially the same method as Example 1 except that the photoresist composition included about 100 g of the second binder resin without the first binder resin.

COMPARATIVE EXAMPLE 2

A photoresist composition was prepared through substantially the same method as Example 1 except that the photoresist composition included about 100 g of the first binder resin without the second binder resin.

The photoresist compositions of Examples 1 to 5 and Comparative Examples 1 and 2 were respectively coated on a substrate to form photoresist films. The photoresist films were exposed to light and developed (a developing speed: about 25 seconds) to form photoresist patterns. The photoresist patterns were heated to measure a reflow temperature of each of the photoresist patterns. Furthermore, a metal etching test (spraying, at about 40° C., for about 65 seconds) was conducted on each of the photoresist patterns by using an etchant including phosphoric acid, nitric acid and acetic acid to measure the length of a skew of each of the photoresist patterns. Thus, the obtained results are shown in the following Table 1.

TABLE 1

| | Reflow Temperature (° C.) | Length of Skew (μm) |
| --- | --- | --- |
| Example 1 | 130 | 0.78 |
| Example 2 | 140 | 0.83 |
| Example 3 | 140 | 0.79 |
| Example 4 | 140 | 0.74 |
| Example 5 | 140 | 0.69 |
| Comparative Example 1 | 120 | 0.72 |
| Comparative Example 2 | 150 | 1.10 |

Referring to Table 1, the photoresist pattern of Comparative Example 1 reflowed at a relatively low temperature compared to the photoresist patterns of Example 1 to 5, and the photoresist pattern of Comparative Example 2 had a relatively long skew compared to the photoresist patterns of Example 1 to 5. Thus, it can be noted that a photoresist composition including only the second binder resin formed from formaldehyde may deteriorate heat resistance and a photoresist composition including only the first binder resin formed from salicylic aldehyde may deteriorate adhesion ability and etching resistance.

Referring to the results of Examples 3 to 5, it can be noted that a photoresist composition including the phenol compound having a low molecular weight may improve the adhesion ability and etching resistance of a photoresist pattern without deteriorating heat resistance.

Figure 9:
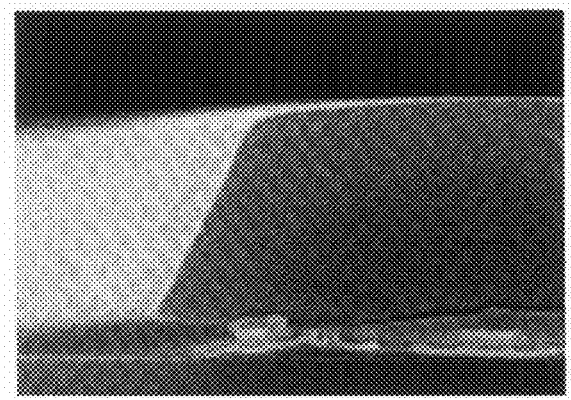
FIG. 9 is a scanning electron microscope (SEM) picture showing a photoresist pattern formed using a conventional positive photoresist composition.
Figure 10:
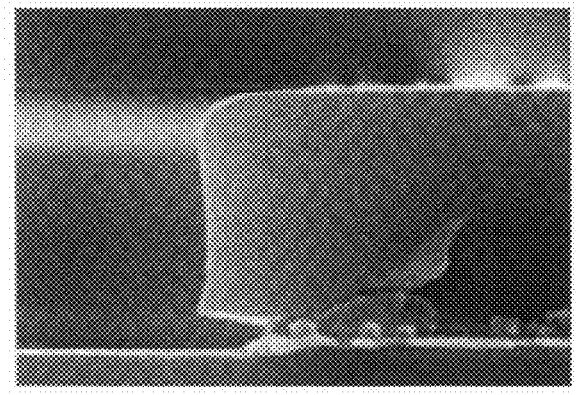
FIG. 10 is an SEM picture showing a photoresist pattern formed using a photoresist composition according to an example of the present invention.

FIG. 9 is a scanning electron microscope (SEM) picture showing a photoresist pattern formed using a conventional positive photoresist composition. FIG. 10 is an SEM picture showing a photoresist pattern formed using a photoresist composition according to an example of the present invention. Particularly, the FIG. 10 shows a photoresist pattern formed using a photoresist composition of Example 3.

An angle between a substrate and an edge of the photoresist pattern of FIG. 10 was relatively large compared to FIG. 9, and a width of an undercut of FIG. 10 was relatively short compared to FIG. 9. Particularly, the width of the undercut of the photoresist pattern of FIG. 9 was about 0.86 μm, and the width of the undercut of the photoresist pattern of FIG. 10 was about 0.82 μm. Thus, it can be noted that a photoresist composition according to an embodiment of the present invention may reduce the length of a protrusion of an active layer to improve the aperture ratio of a thin-film transistor substrate.

According to the above, a photoresist composition according to an example embodiment of the present invention may improve the heat resistance and adhesion ability of a photoresist pattern. Thus, the aperture ratio of a thin-film transistor substrate may be increased, and the display quality of a display apparatus may be improved.

Although embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A method of manufacturing a thin-film transistor substrate, the method comprising:
   sequentially forming a gate insulation layer, an active layer and a data metal layer on a base substrate having a gate line and a gate electrode;

coating a photoresist composition on the data metal layer to form a photoresist film, the photoresist composition comprising:

about 1 to about 70 parts by weight of a first binder resin for increasing heat resistance and including a repeat unit represented by

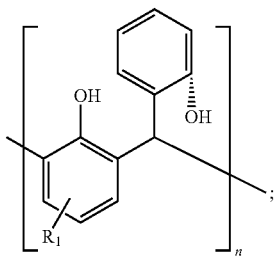

about 1 to about 70 parts by weight of a second binder resin for increasing adhesion ability and containing a repeat unit represented by

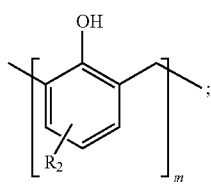

wherein $R_1$ and $R_2$ independently represent an alkyl group having 1 to 5 carbon atoms, and n and m independently represent a natural number;

about 0.5 to about 10 parts by weight of a photo-acid generator;

about 1 to about 20 parts by weight of a cross-linker; and about 10 to about 200 parts by weight of a solvent;

exposing the photoresist film to light and developing the photoresist film to form a first photoresist pattern;

etching the data metal layer and the active layer using the first photoresist pattern as a mask to form a data line and a channel portion, respectively;

removing a portion of the first photoresist film to form a second photoresist pattern exposing a portion of the data metal layer; and etching the data metal layer and the active layer using the second photoresist pattern as a mask to form a source electrode, a drain electrode and an ohmic contact pattern.

2. The method of claim 1, wherein the first photoresist pattern has a channel region having a relatively small thickness.

3. The method of claim 1, wherein the data metal layer is etched through a wet etching process.

4. The method of claim 1, wherein the photo-acid generator includes at least one compound selected from the group consisting of an onium salt, a halogenated organic compound, a quinone diazide compound, a bis(sulfonyl)diazomethane compound, a sulfone compound, an organic acid-ester compound, an organic acid-amide compound, and an organic acid-imide compound.

5. The method of claim 1, wherein the cross-linker includes at least one resin selected from the group consisting of an alkoxymethylated urea resin, an alkoxymethylated melamine resin, an alkoxymethylated uron resin and an alkoxymethylated glycol uryl resin.

6. The method of claim 1, wherein the solvent includes at least one selected from the group consisting of a glycol ether, an ethylene glycol alkyl ether acetate and a diethylene glycol.

7. The method of claim 1, wherein the photoresist composition further comprises about 0.1 to about 10 parts by weight of a compound represented by

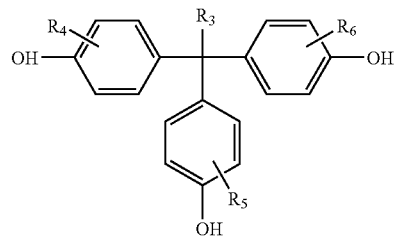

wherein $R_3$, $R_4$, $R_5$ and $R_6$ independently represent an alkyl group having 1 to 4 carbon atoms.

8. The method of claim 1, wherein the photoresist composition further comprises about 0.1 to about 5 parts by weight of a dye including at least one dye selected from the group consisting of a pyrazoleazo-based dye, an anilinoazo-based dye, an arylazo-based dye, a triphenylmethane-based dye, an anthraquinone-based dye, an anthrapyridone-based dye, a benzylidene-based dye, an oxonol-based dye, a pyrazoletriazoleazo-based dye, a pyridoneazo-based dye, a cyanine-based dye, a phenothiazine-based dye, a pyrrolopyrazoleazomethine-based dye, a xanthene-based dye, a phthalocyanine-based dye, a benzopyran-based dye and an indigo-based dye.

9. The method of claim 1, wherein the photoresist composition further comprises about 0.1 to about 10 parts by weight of an additive including at least one selected from the group consisting of an adhesion promotion agent, a surfactant and an acid diffusion suppressant.

* * * * *